US008625226B2

(12) United States Patent
Christensen et al.

(10) Patent No.: US 8,625,226 B2
(45) Date of Patent: Jan. 7, 2014

(54) FIXING TAP COEFFICIENTS IN A PROGRAMMABLE FINITE-IMPULSE-RESPONSE EQUALIZER

(75) Inventors: Eric Rolf Christensen, Tucson, AZ (US); Ernest Stewart Gale, Tucson, AZ (US); Robert Allen Hutchins, Tucson, AZ (US); Sedat Oelcer, Kilchberg (CH)

(73) Assignee: International Business Machines Corporation, Armonk, NY (US)

( * ) Notice: Subject to any disclaimer, the term of this patent is extended or adjusted under 35 U.S.C. 154(b) by 138 days.

(21) Appl. No.: 13/304,227

(22) Filed: Nov. 23, 2011

(65) Prior Publication Data

US 2013/0128374 A1 May 23, 2013

(51) Int. Cl.
| | |
|---|---|
| G11B 5/035 | (2006.01) |
| G11B 20/10 | (2006.01) |
| H03H 7/30 | (2006.01) |
| H03H 7/40 | (2006.01) |
| H03K 5/159 | (2006.01) |

(52) U.S. Cl.
USPC ............................... 360/65; 360/39; 375/232

(58) Field of Classification Search
None
See application file for complete search history.

(56) References Cited

U.S. PATENT DOCUMENTS

| | | | |
|---|---|---|---|
| 6,381,085 B1 | 4/2002 | Du et al. | |
| 6,385,239 B1 | 5/2002 | Okamoto et al. | |
| 6,523,052 B1 | 2/2003 | Staszewski | |
| 6,810,096 B1 * | 10/2004 | Saito et al. | 375/341 |
| 7,436,615 B2 | 10/2008 | Eleftheriou | |
| 7,468,940 B2 * | 12/2008 | Higashino | 369/59.22 |
| 7,589,927 B2 | 9/2009 | Hutchins et al. | |
| 7,663,831 B2 | 2/2010 | Hayashi et al. | |
| 7,982,985 B1 | 7/2011 | Chaichanavong | |
| 2001/0043651 A1 * | 11/2001 | Nishimura et al. | 375/232 |

FOREIGN PATENT DOCUMENTS

| | | |
|---|---|---|
| CM | CN1306703 A | 1/2001 |
| CN | 1860546 A | 8/2006 |

OTHER PUBLICATIONS

Combined Search and Examination Report under Sections 17 and 18(3), Application No. GB1214206.3, Dec. 6, 2012.
PCT International Search Report and Written Opinion, International App. No. PCT/IB2012/056274, Mar. 28, 2013.
Reply to International Search Report and Written Opinion, App. No. GB1214206.3, Jan. 29, 2013.

* cited by examiner

*Primary Examiner* — Regina N Holder
(74) *Attorney, Agent, or Firm* — Nelson and Nelson; Daniel P. Nelson; Alexis V. Nelson (57) ABSTRACT

A method for selecting which tap coefficients of a programmable finite-impulse-response (FIR) equalizer to fix is disclosed. In one embodiment, such a method includes performing an initial calibration to determine an initial value for each tap coefficient of a FIR equalizer. These initial values may be used to produce a first waveform. The method then performs an operation on the first waveform to produce a second waveform comprising multiple lobes. The second waveform is then analyzed to determine one or more lobes of the second waveform that have the largest area. The method then fixes coefficients of one or more taps that are closest to the lobe or lobes having the largest area. A corresponding apparatus and computer program product are also disclosed.

20 Claims, 10 Drawing Sheets

| | | | | | | | | |
|---|---|---|---|---|---|---|---|---|
| H0 | -2 | | | | | | | |
| H1 | 7 | | | | | | | |
| H2 | -28 | | | | | | | |
| H3 | 48 | | | | | | | |
| H4 | -43 | | | | | | | |
| H5 | -15 | X | | | | | | |
| H6 | 71 | X | X | | | | | |
| H7 | -36 | X | X | X | | | | |
| H8 | -114 | X | X | X | X | | | |
| H9 | 127 | | X | X | X | X | | |
| H10 | 69 | | | X | X | X | X | |
| H11 | -86 | | | | X | X | X | X |
| H12 | 14 | | | | | X | X | X | X |
| H13 | 34 | | | | | | X | X | X |
| H14 | -47 | | | | | | | X | X |
| H15 | 32 | | | | | | | | X |
| H16 | -14 | | | | | | | | |
| Converge? | | No | No | Yes | Yes | Yes | No | No | No |

| H0 | 11 | | | | | | | | |
|---|---|---|---|---|---|---|---|---|---|
| H1 | -2 | | | | | | | | |
| H2 | -60 | X | | | | | | | |
| H3 | 127 | X | X | | | | | | |
| H4 | -89 | X | X | X | | | | | |
| H5 | -88 | X | X | X | X | | | | |
| H6 | 125 | | X | X | X | X | | | |
| H7 | 75 | | | X | X | X | X | | |
| H8 | -81 | | | | X | X | X | X | |
| H9 | -11 | | | | | X | X | X | X |
| H10 | 81 | | | | | | X | X | X |
| H11 | -87 | | | | | | | X | X |
| H12 | 45 | | | | | | | | X |
| H13 | 3 | | | | | | | | |
| H14 | -32 | | | | | | | | |
| H15 | 27 | | | | | | | | |
| H16 | -10 | | | | | | | | |
| Converge? | | No | No | Yes | Yes | Yes | No | No | No |

| | | | | | | | | |
|---|---|---|---|---|---|---|---|---|
| H0 | -55 | | | | | | | |
| H1 | 127 | X | | | | | | |
| H2 | -110 | X | X | | | | | |
| H3 | -57 | X | X | X | | | | |
| H4 | 87 | X | X | X | X | | | |
| H5 | 107 | | X | X | X | X | | |
| H6 | -109 | | | X | X | X | X | |
| H7 | 22 | | | | X | X | X | X |
| H8 | 24 | | | | | X | X | X | X |
| H9 | -25 | | | | | | X | X | X |
| H10 | 6 | | | | | | | X | X |
| H11 | 9 | | | | | | | | X |
| H12 | -23 | | | | | | | | |
| H13 | 26 | | | | | | | | |
| H14 | -20 | | | | | | | | |
| H15 | 10 | | | | | | | | |
| H16 | -3 | | | | | | | | |
| Converge? | | No | Yes | Yes | Yes | No | No | No | No |

FIXING TAP COEFFICIENTS IN A PROGRAMMABLE FINITE-IMPULSE-RESPONSE EQUALIZER

BACKGROUND

1. Field of the Invention

This invention relates to apparatus and methods for reading data on storage media such as magnetic tape.

2. Background of the Invention

As the storage capacities of modern tape cartridges are pushed higher and higher, it is becoming increasingly difficult to read data from magnetic tape. Small variations in manufacturing or variations in temperature, humidity, or head-to-tape interfaces can cause changes in the read-back signal which may cause traditional recording channels to fail to detect data. Modern tape drives are able to handle this variability by being adaptable. Based upon the signals read from tape, the read-detect channel of the modern tape drive can adjust the equalization of the read-back signal to improve the signal-to-noise ratio. It can also compensate for head asymmetry or modify data detection parameters to improve the detection reliability.

One of the problems with the adaptability discussed above is that sometimes the read-detect channel does not converge to an optimal configuration. Instead, it may diverge from an optimal configuration such that data can no longer be detected. With otherwise good media, head, and tape path, the channel may adapt in a manner that renders the data useless. This problem tends to get worse as the storage density of tape increases.

Divergence of the equalizer is the primary cause of read-detect channel instability. In many cases, this divergence may be controlled by fixing a certain number of tap coefficients in the adaptable finite-impulse-response (FIR) equalizer (also known as a FIR filter). For example, in a typical FIR equalizer that includes seventeen taps, four tap coefficients out of seventeen may be fixed. If the correct tap coefficients are fixed, then the FIR equalizer will be stable and the FIR equalizer will converge to an optimal configuration (assuming that the initial configuration of the FIR equalizer was reasonable). If the wrong tap coefficients are fixed, then the FIR equalizer will not converge and the equalization will eventually get so bad that the data read will not be usable.

In the FIR equalizers of many current tape drives, four adjacent tap coefficients out of seventeen are fixed. In such drives, the initial configuration (i.e., tap coefficients) of the equalizer may be determined using a calibration procedure. The largest tap coefficient of the seventeen may then be fixed. Two tap coefficients on one side of the largest tap coefficient and one tap coefficient on the other side of the largest tap coefficient may be fixed. The side with the two fixed tap coefficients is typically selected to be in the direction of the next largest tap coefficient of the seventeen coefficients. This methodology has worked well historically. However, as tape linear densities have increased and recording properties of the storage media have changed, this methodology increasingly results in divergent FIR equalizers.

In view of the foregoing, what is needed is an improved methodology to select which tap coefficients of a programmable FIR equalizer to fix. Ideally, such a methodology will allow FIR equalizers to more consistently converge to an optimal configuration that improves, rather than worsens, the signal to noise ratio.

SUMMARY

The invention has been developed in response to the present state of the art and, in particular, in response to the problems and needs in the art that have not yet been fully solved by currently available apparatus and methods. Accordingly, the invention has been developed to provide apparatus and methods for more effectively selecting which tap coefficients of a programmable finite-impulse-response (FIR) equalizer to fix. The features and advantages of the invention will become more fully apparent from the following description and appended claims, or may be learned by practice of the invention as set forth hereinafter.

Consistent with the foregoing, a method for selecting which tap coefficients of a programmable finite-impulse-response (FIR) equalizer to fix is disclosed herein. In one embodiment, such a method includes performing an initial calibration to determine an initial value for each tap coefficient of a FIR equalizer. These initial values may be used to produce a first waveform. The method then performs an operation on the first waveform to produce a second waveform comprising multiple lobes. The second waveform is then analyzed to determine one or more lobes of the second waveform that have the largest area. The method then fixes coefficients of one or more taps that are closest to the lobe or lobes having the largest area.

A corresponding apparatus and computer program product are also disclosed and claimed herein.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

As will be appreciated by one skilled in the art, the present invention may be embodied as an apparatus, system, method, or computer program product. Furthermore, the present invention may be implemented as a hardware embodiment, a software embodiment (including firmware, resident software, microcode, etc.) configured to operate hardware, or an embodiment combining both software and hardware elements. Each of these embodiments may be represented by one or more modules or blocks. Furthermore, the present invention may be implemented in a computer-usable storage medium embodied in any tangible medium of expression having computer-usable program code stored therein.

Any combination of one or more computer-usable or computer-readable storage medium(s) may be utilized to store the computer program product. The computer-usable or computer-readable storage medium may be, for example, but not limited to, an electronic, magnetic, optical, electromagnetic, infrared, or semiconductor system, apparatus, or device. More specific examples (a non-exhaustive list) of the computer-readable storage medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, or a magnetic storage device. In the context of this document, a computer-usable or computer-readable storage medium may be any medium that can contain, store, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like, and conventional procedural programming languages, such as the "C" programming language or similar programming languages. Computer program code for implementing the invention may also be written in a low-level programming language such as assembly language.

The present invention may be described below with reference to flowchart illustrations and/or block diagrams of methods, apparatus, systems, and computer program products according to embodiments of the invention. It will be understood that each block of the flowchart illustrations and/or block diagrams, and combinations of blocks in the flowchart illustrations and/or block diagrams, may be implemented by computer program instructions or code. The computer program instructions may be provided to a processor of a general-purpose computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be stored in a computer-readable storage medium that can direct a computer or other programmable data processing apparatus to function in a particular manner, such that the instructions stored in the computer-readable storage medium produce an article of manufacture including instruction means which implement the function/act specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 1:
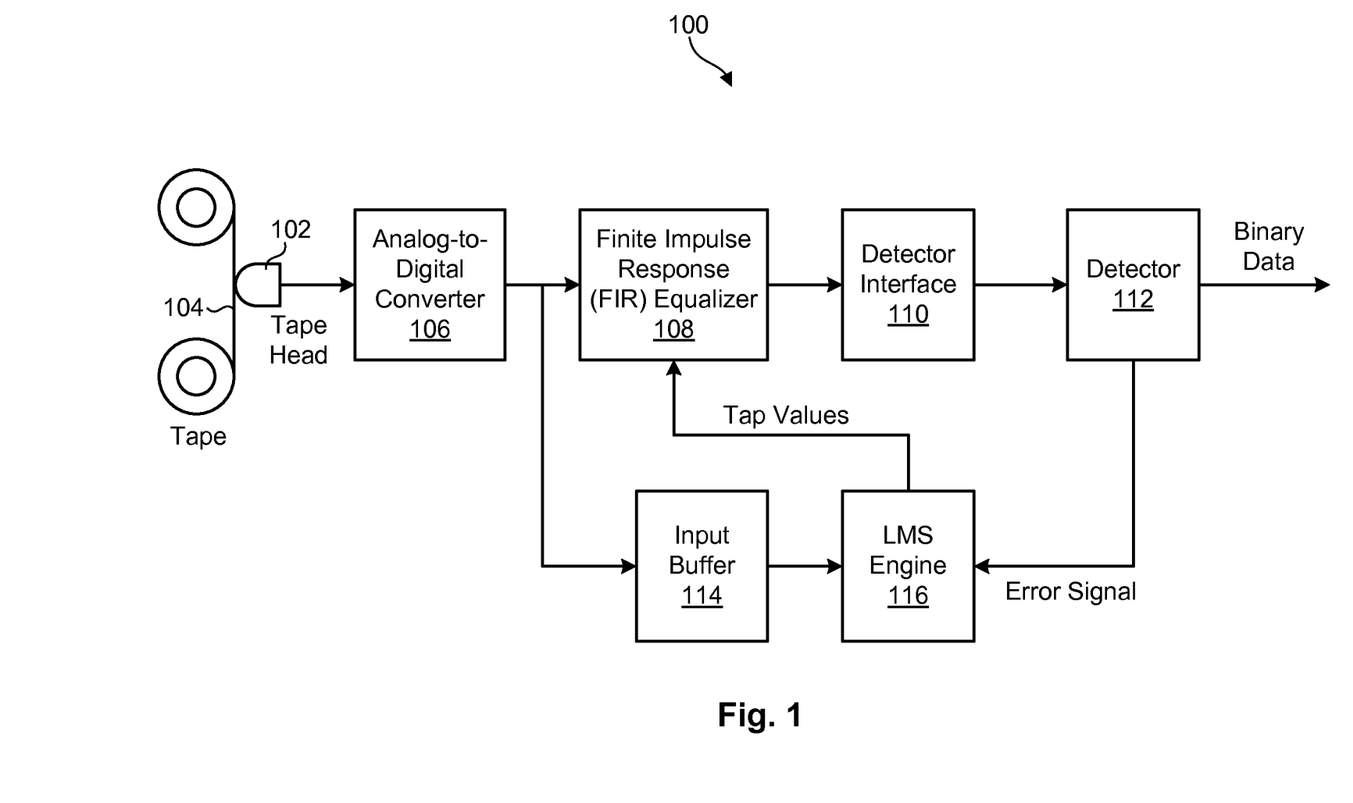
FIG. 1 is a high-level block diagram showing one example of a read-detect channel for a tape drive.

Referring to FIG. 1, a high-level block diagram showing one example of a read-detect channel circuit 100 for a tape drive is illustrated. There are typically sixteen or thirty-two read detect channels 100 per tape drive, although other numbers of channels are possible. During a read operation, a tape head 102 is typically passed over data recorded on magnetic tape 104 in order to convert the recorded data into an analog signal. In particular, in a magnetic tape drive, a magnetoresistive read head 102 is passed over data that has been previously written as flux reversals on the magnetic tape 104. As the head 102 is passed over the tape 104, the head 102 converts the flux reversals into an electrical analog signal that represents the data originally stored on the magnetic tape 104.

An analog-to-digital converter 106 ("ADC") periodically samples the analog signal and converts the sampled analog signal to a digital input signal and creates a digital waveform. The output of the analog-to-digital converter 106 may then be sent to a finite-impulse-response (FIR) equalizer 108 to shape the digital waveform. The digital waveform may then be sent to a detector 112 by way of a detector interface 110. The detector 112 may convert the digital waveform to a binary stream of ones and zeros which ideally reflects the data that was originally written to the magnetic tape 104.

Upon producing the binary data, the detector 112 produces an error signal which indicates the error between the equalizer output and the desired detector input. This error signal may be sent to a least means square (LMS) engine 116 which uses the error signal to adjust selected taps coefficients of the FIR equalizer 108. An input buffer 114 may be used to temporally align the error signal with the output received from the analog-to-digital converter 106. In practice, as will be explained in more detail hereafter, certain adjacent tap coefficients of the FIR equalizer 108 may be fixed while other tap coefficients may be allowed to adapt (i.e., adjust their values to optimal values) in response to the error signal. This ideally allows the FIR equalizer 108 to remain stable while still allowing it to adapt to the error signal. Two examples of FIR equalizer circuits 108 are illustrated in FIGS. 2 and 3.

Figure 2:
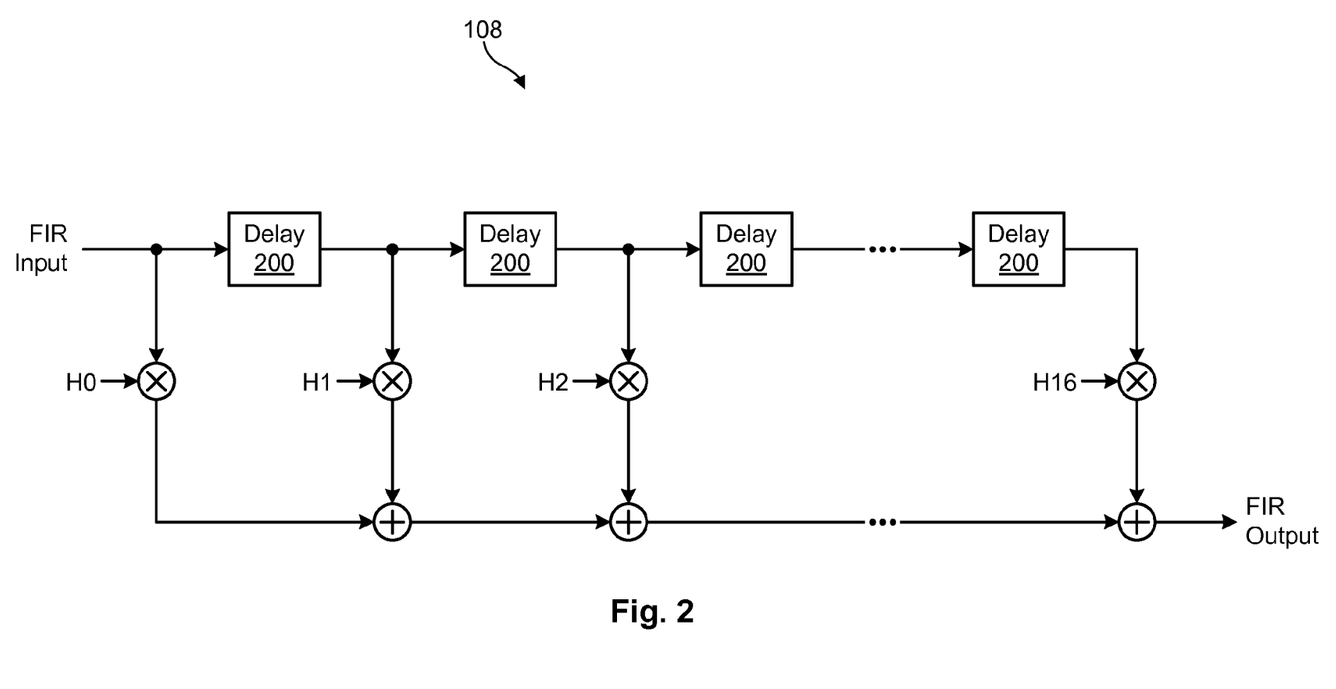
FIG. 2 is a high-level block diagram showing a conventional programmable finite-impulse-response (FIR) equalizer.
Figure 3:
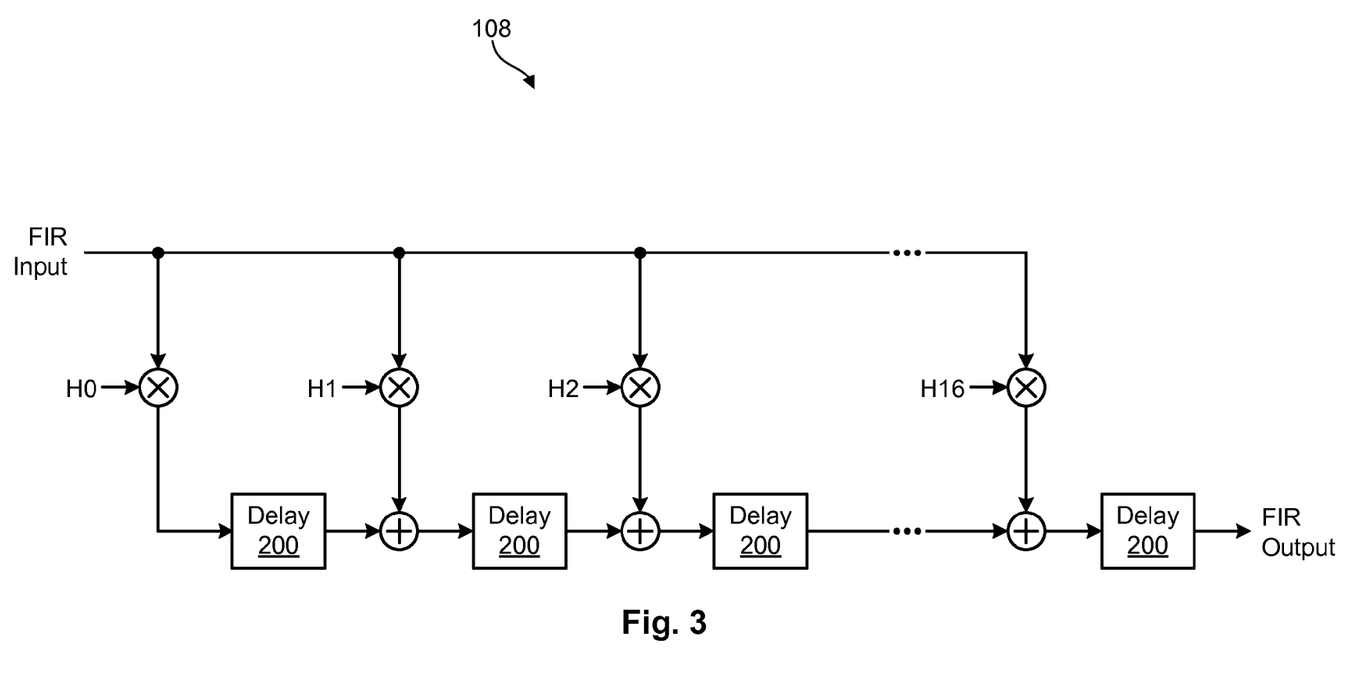
FIG. 3 is a high-level block diagram showing a programmable FIR equalizer that is functionally equivalent to the programmable FIR equalizer illustrated in FIG. 2.

Referring to FIG. 2, a high-level block diagram showing an example of a conventional programmable finite-impulse-response (FIR) equalizer 108 is illustrated. As shown, the output of the FIR equalizer 108 is generated by convolving its input signal with the FIR equalizer's impulse response. The output of the FIR equalizer 108 is a weighted sum of the current and a finite number of previous values of the input. Delay units 200 (which may be implemented using registers, for example) may output the previous values of the input. The values (H0, H1, H2, . . . , Hn) are tap coefficients that control the impulse response.

In the illustrated embodiment, the FIR equalizer 108 includes seventeen taps and associated tap coefficients. Such FIR equalizers 108 generally provide an optimal balance between cost and stability and thus are used in the read-detect channels 100 of many current tape drives. More taps may increase the cost of the FIR equalizer 108 while providing little additional benefit in terms of signal-to-noise ratio (SNR). Fewer taps may decrease the cost of the FIR equalizer 108 but undesirably reduce the SNR.

Nevertheless, the disclosed FIR equalizer 108 is not limited to seventeen taps but may include more or fewer taps as needed. Furthermore, the methodology disclosed herein is not limited to FIR equalizers 108 having seventeen taps but may be used with FIR equalizers 108 having any number of taps. A FIR equalizer 108 that is physically different from, but functionally equivalent to, the FIR equalizer 108 illustrated in FIG. 2 is shown in FIG. 3.

In order to account for changes to the read-back signal caused by variations in manufacturing, temperature, humidity, and/or the head-to-tape interface, certain tap coefficients of the FIR equalizer 108 may be allowed to vary. Based upon the signals read from the magnetic tape 104, the read-detect channel 100 may adjust the equalization of the read-back signal by modifying the tap coefficients. One drawback of this approach is that, if the wrong tap coefficients are allowed to vary, the tap coefficients may vary in a way that actually worsens the signal-to-noise ratio. In some cases, the tap coefficients may vary in such a way that data on the magnetic tape 104 can no longer be detected.

Thus, an improved method is needed to correctly select which tap coefficients of a FIR equalizer 108 to fix, thereby also selecting the tap coefficients of the FIR equalizer 108 that are allowed to vary. Ideally, such a method will enable the FIR equalizer 108 to more consistently converge to an optimal configuration that improves the signal-to-noise ratio of the data being read. One embodiment of such a method will be described in association with FIG. 4.

Figure 4:
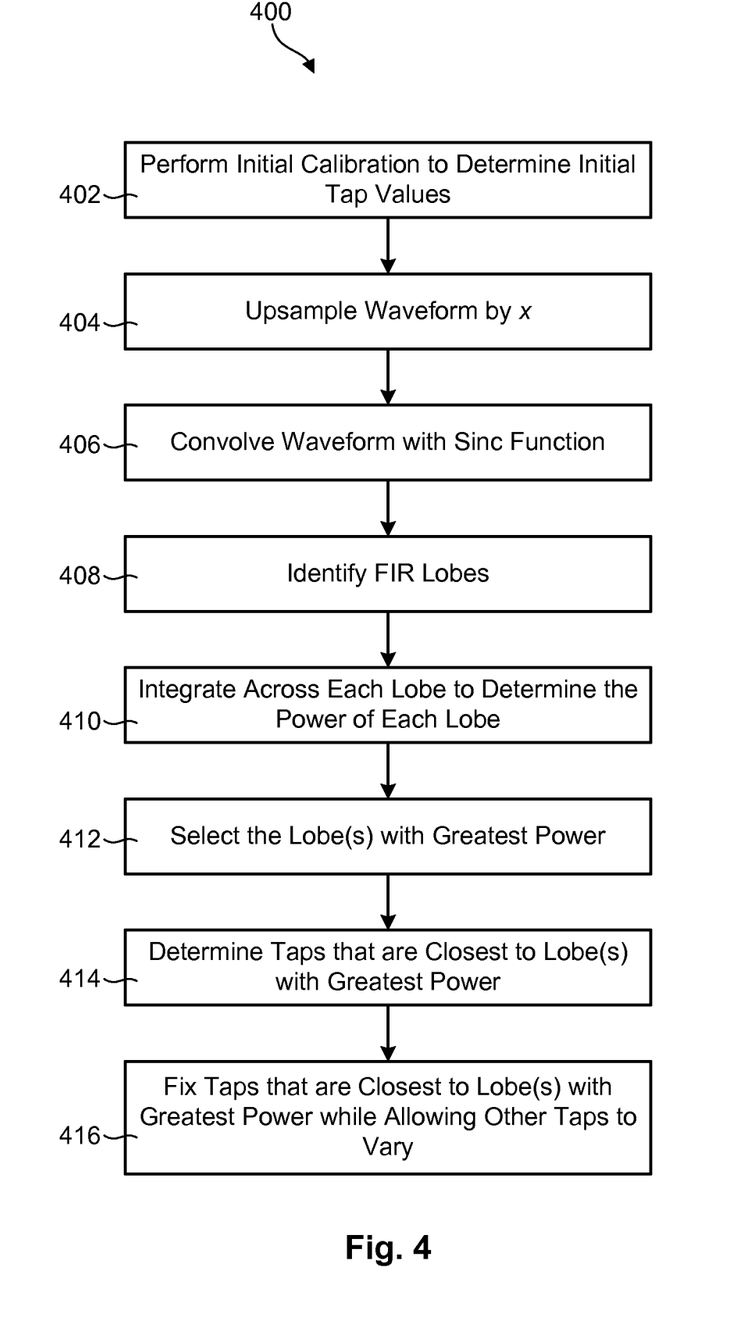
FIG. 4 is a flow chart showing one embodiment of an improved method for selecting which tap coefficients of a programmable finite-impulse-response (FIR) equalizer to fix.

Referring to FIG. 4, one embodiment of an improved method 400 for selecting which tap coefficients of a FIR equalizer 108 to fix is illustrated. As shown, the method 400 begins by performing 402 an initial calibration procedure to determine initial values for the FIR's tap coefficients. In certain embodiments, the initial calibration is performed 402 by reading calibration data on magnetic tape 104 and setting the tap coefficients to maximize the signal-to-noise ratio of the calibration data. In other embodiments, the initial calibration is performed 402 by simply setting the tap coefficients to values read from the magnetic tape 104 or another location.

Once the initial values for the tap coefficients are determined, the tap coefficients are upsampled 404 by some number x, such as eight. For example, in the case of a FIR equalizer 108 with seventeen taps, upsampling by eight will provide (8×17=136) coefficients. The upsampling may be performed by inserting (x−1) zeros between each FIR coefficient value (with x/2 zeros before H0 and (x/2)−1 zeros after H16). For upsampling by eight with a seventeen tap FIR equalizer 108, seven zeros may be inserted between each FIR tap coefficient with four zeros before H0 and three zeros after H16. These coefficients may be used to produce a first waveform. The first waveform may then be convolved 406 with a Sinc function to provide a second waveform that is a modified version of the first waveform. One or more lobes of the second waveform may then be identified 408 by identifying zero crossings of the second waveform. In certain embodiments, the absolute value (i.e., magnitude) of the second waveform is determined to facilitate computing the power of each lobe.

The method 400 may then integrate 410 across each lobe to determine each lobe's power (i.e., area). In certain embodiments, the power of each lobe is determined by taking the magnitude of every sample within the lobe and summing them together. One or more adjacent lobes having the greatest power may then be selected 412. In one embodiment, for example, two adjacent lobes having the greatest power may be selected 412. The method 400 may then determine 414 which tap or taps are closest to the lobe(s) with the greatest power. For example, when applying the methodology 400 to a FIR equalizer 108 having seventeen taps, the method 400 may determine 414 the three or four adjacent taps that are closest to the lobe(s) with the greatest power. The method 400 may then fix 416 the coefficients of these taps while allowing the coefficients of the other taps to vary.

Figure 5A:
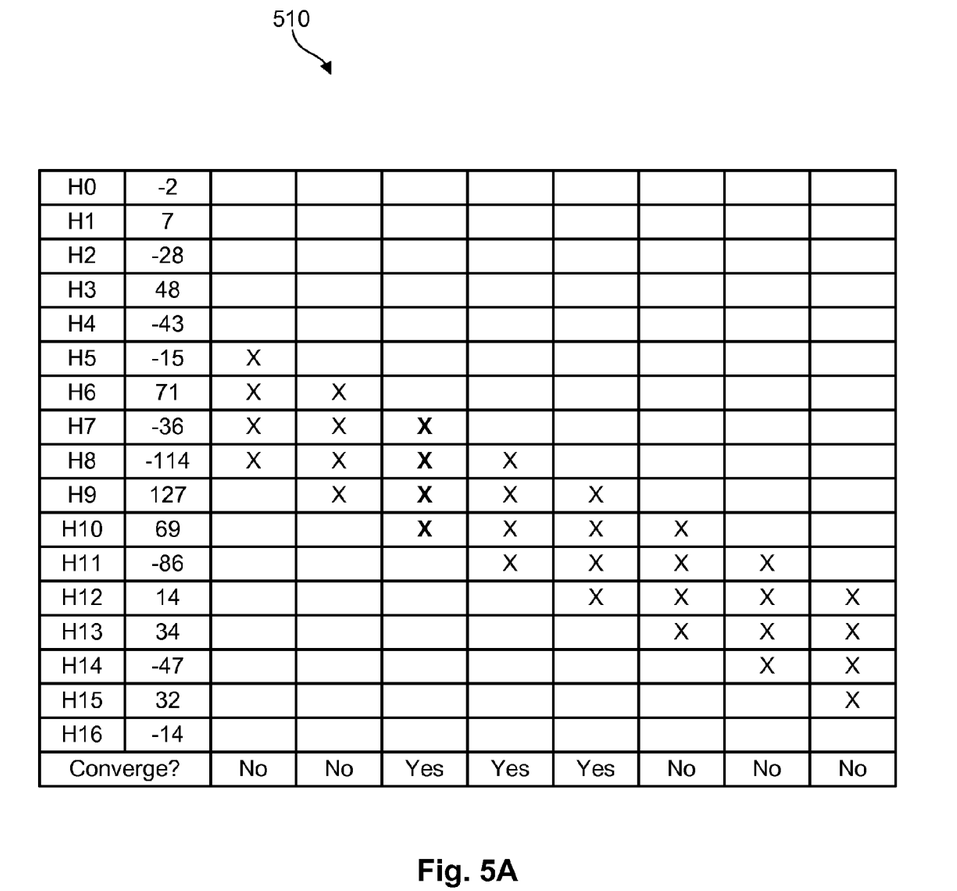
FIG. 5A is a table showing initial tap coefficients for a first exemplary FIR, as well as tap coefficients that are fixed using an improved method in accordance with the invention.
Figure 5B:
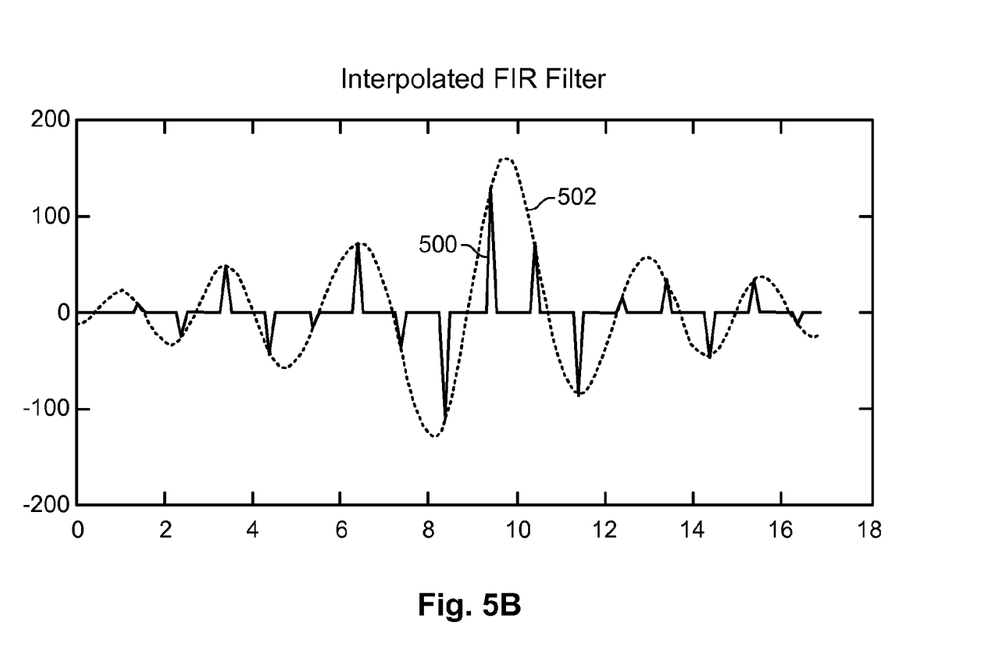
FIG. 5B is a graph showing a first waveform generated for the first exemplary FIR, and a second waveform representing a modified version of the first waveform.
Figure 5C:
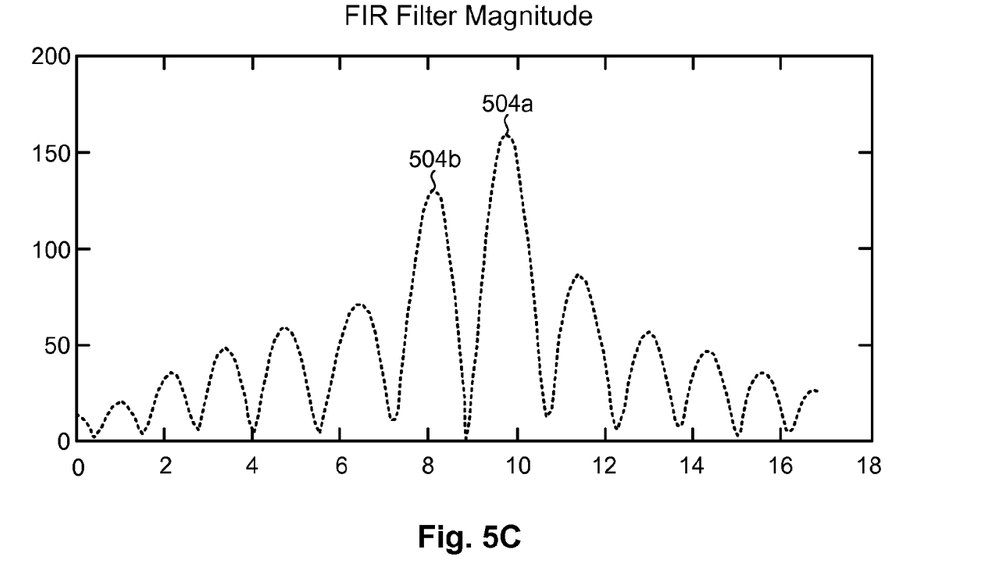
FIG. 5C is a graph showing the magnitude of the second waveform illustrated in FIG. 5B.
Figure 6A:
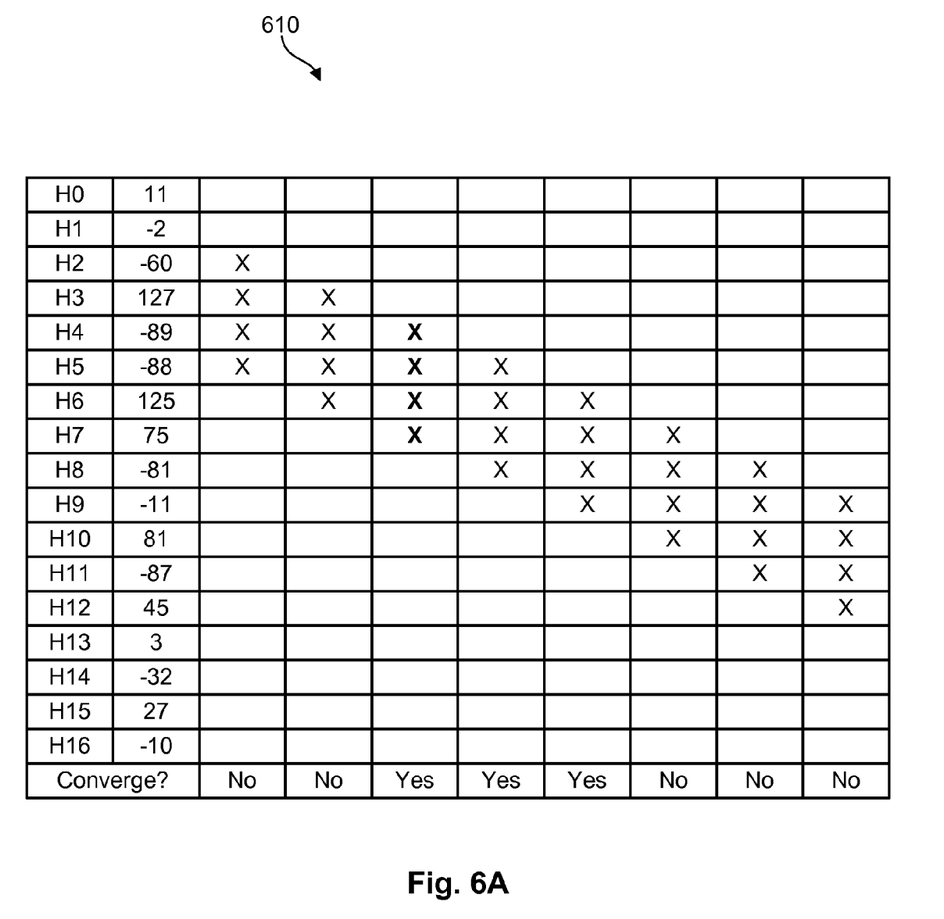
FIG. 6A is a table showing initial tap coefficients for a second exemplary FIR, as well as tap coefficients that are fixed using an improved method in accordance with the invention.
Figure 6B:
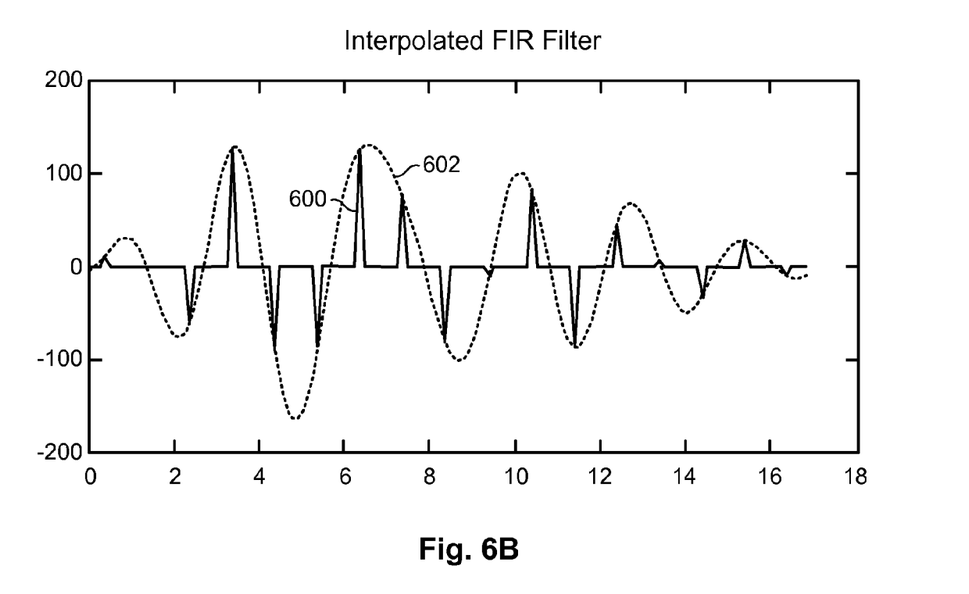
FIG. 6B is a graph showing a first waveform generated for the second exemplary FIR, and a second waveform representing a modified version of the first waveform.
Figure 6C:
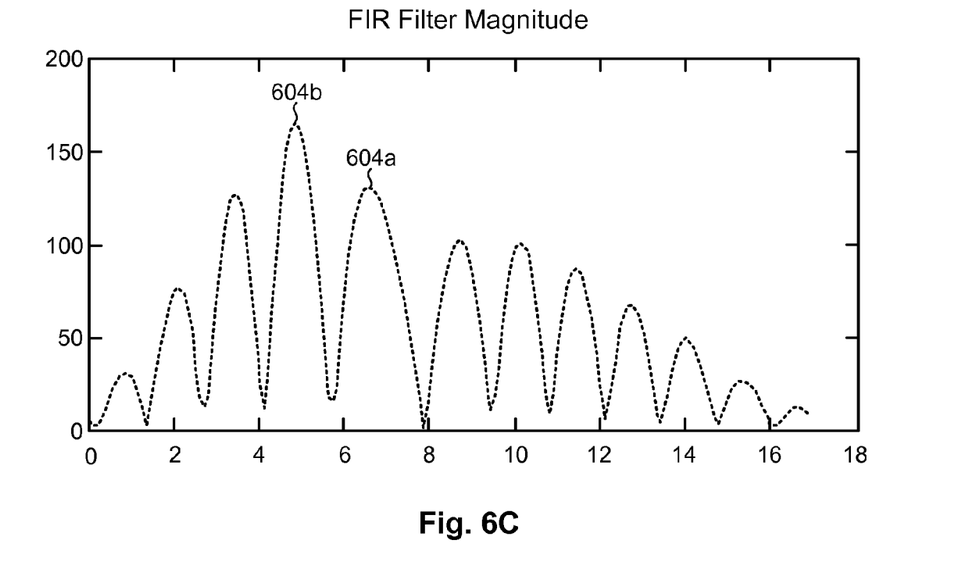
FIG. 6C is a graph showing the magnitude of the second waveform illustrated in FIG. 6B.
Figure 7A:
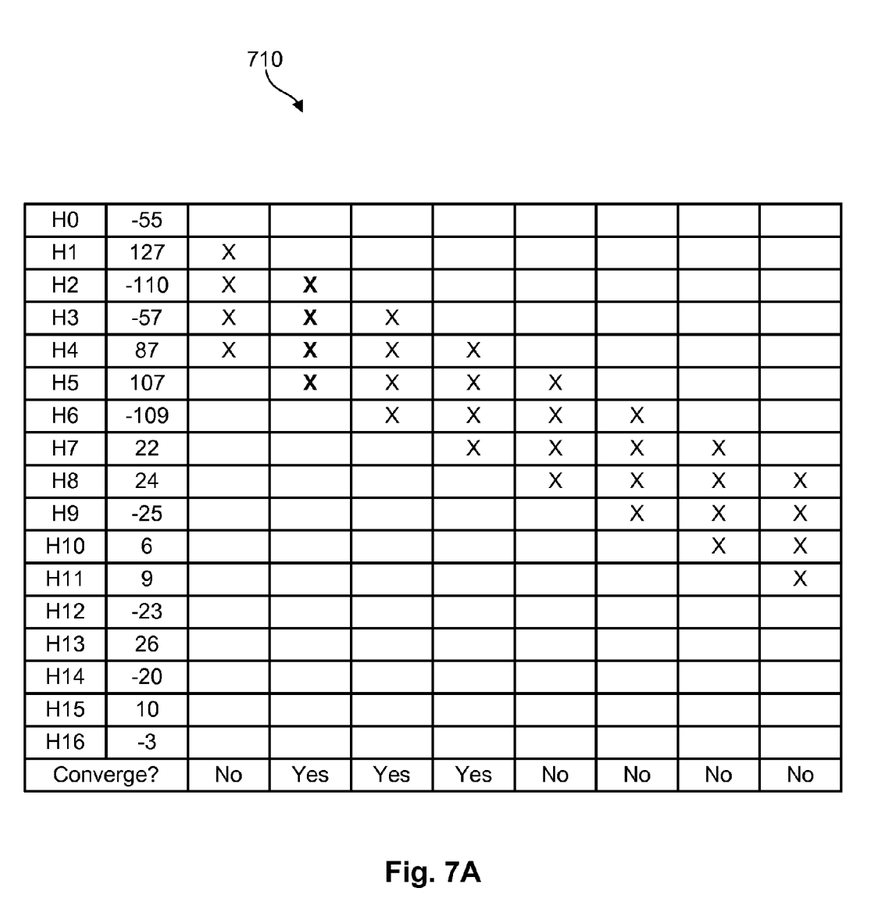
FIG. 7A is a table showing initial tap coefficients for a third exemplary FIR, as well as tap coefficients that are fixed using an improved method in accordance with the invention.
Figure 7B:
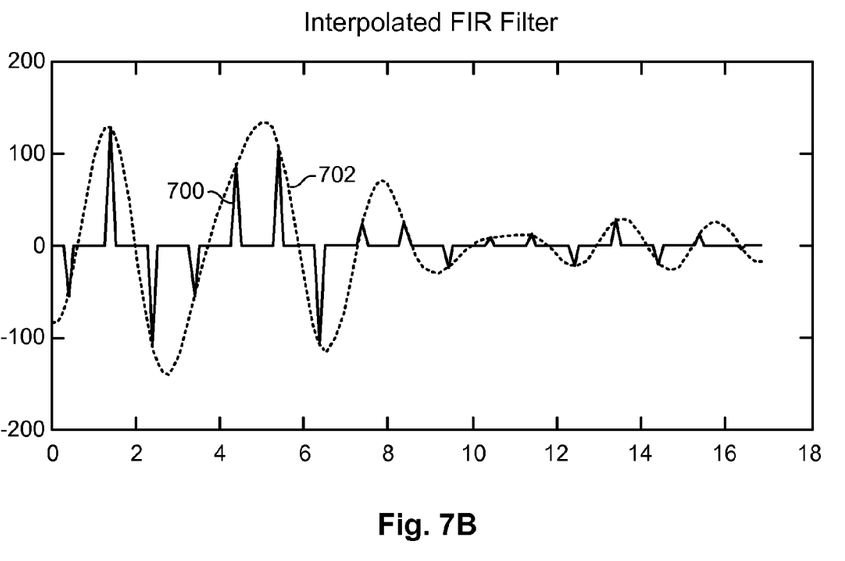
FIG. 7B is a graph showing a first waveform generated for the third exemplary FIR, and a second waveform representing a modified version of the first waveform.
Figure 7C:
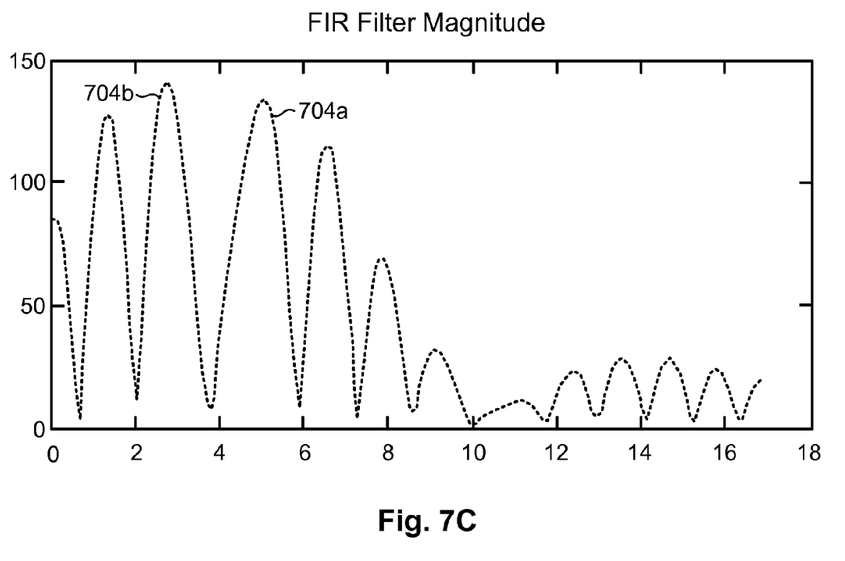
FIG. 7C is a graph showing the magnitude of the second waveform illustrated in FIG. 7B.

The instant inventors have found that the above-described methodology 400 provides a more consistent way to identify fixed tap coefficients that will result in a stable (i.e., converging) FIR equalizer 108. Several specific examples of applying the methodology 400 to actual real-world FIR equalizers 108 are described in association with FIGS. 5A through 7C. More specifically, FIGS. 5A through 5C show the application of the methodology 400 to a first real-world FIR equalizer 108; FIGS. 6A through 6C show the application of the methodology 400 to a second real-world FIR equalizer 108; and FIGS. 7A through 7C show the application of the methodology 400 to a third real-world FIR equalizer 108. In each of these examples, the methodology 400 successfully identified fixed tap coefficients that resulted in a stable FIR equalizer 108.

Referring to FIG. 5A, a table 510 showing the initial tap coefficients for a first exemplary FIR equalizer 108 is illustrated. The initial tap coefficients are listed vertically along the left-hand side of the table 510. Using the methodology 400 of FIG. 4, the initial seventeen tap coefficients were upsampled by eight to yield 136 coefficients. These 136 coefficients were then used to produce a first waveform 500, as shown in FIG. 5B. The magnitude of the spikes of the first waveform 500 represent the magnitude of the coefficients listed in FIG. 5A. The portion of the waveform 500 between the spikes is representative of the additional samples (i.e., zeros) generated during the upsampling step 404.

As further specified by the methodology 400, the first waveform is convolved 406 with a sinc function to generate a second waveform 502 that represents a modified version of the first waveform. As shown, the second waveform 502 includes multiple "lobes." For the purposes of this specification, a "lobe" is defined to be a portion of a waveform between zero crossings. FIG. 5C shows the magnitude of the lobes of the second waveform 502.

As previously discussed, the methodology 400 integrates each lobe to determine its power. It should be recognized that the integration may be performed on the second waveform 502 illustrated in FIG. 5B or the waveform representing the magnitude of the second waveform 502 as illustrated in FIG. 5C (for the purposes of this specification, each of the waveforms illustrated in FIGS. 5B and 5C are considered to be different variations of the "second waveform 502"). One of more lobes having the greatest power may then be selected 412. In this example, the two largest lobes 504a, 504b are selected. The methodology 400 then determines which tap or taps are closest to the lobes with the greatest power. In this example, the four taps that are closest to the lobes 504a, 504b include taps 7, 8, 9, and 10. Thus, as shown in FIG. 5A, the coefficients H7, H8, H9, and H10 would be fixed using the methodology 400 described in FIG. 4, as indicated in bold.

The instant inventors tested the first real-world FIR equalizer 108 and found that the FIR equalizer 108 converged (i.e., was stable) for three sets of four fixed tap coefficients. The three sets of coefficients are shown in the table 510 of FIG. 5A. More specifically, the sets [H7, H8, H9, H10], [H8, H9, H10, H11], and [H9, H10, H11, H12] were each found to produce a stable FIR equalizer 108 when fixed. As shown, one of the sets ([H7, H8, H9, H10]) was the same as that determined by the methodology 400. Thus, the test confirmed the ability of the above-described methodology 400 to select a correct set of fixed tap coefficients for the first FIR equalizer 108.

Referring to FIG. 6A, a table 610 showing the initial tap coefficients for a second exemplary FIR equalizer 108 is illustrated. The initial tap coefficients are listed vertically along the left-hand side of the table 610. Using the methodology 400 of FIG. 4, the initial seventeen tap coefficients were upsampled by eight to yield 136 coefficients. The 136 coefficients were then used to produce a first waveform 600, as shown in FIG. 6B. The first waveform 600 was then convolved 406 with a sinc function to generate a second waveform 602 comprising multiple lobes. Each lobe was then integrated to determine its power (i.e., area). The two largest lobes 604a, 604b were selected and the four taps closest to the lobes 604a, 604b were determined. In this example, the four taps closest to the lobes 604a, 604b were taps 4, 5, 6, and 7. Thus, as shown in FIG. 6A, the coefficients H4, H5, H6, and H7 were fixed using the methodology 400, as indicated in bold.

The instant inventors tested the second real-world FIR equalizer 108 and found that the FIR equalizer 108 converged (i.e., was stable) using three different sets of four fixed tap coefficients. The three sets of tap coefficients are shown in the table 610 of FIG. 6A. More specifically, the sets [H4, H5, H6, H7], [H5, H6, H7, H8], and [H6, H7, H8, H9] were each found to produce a stable FIR equalizer 108. As shown, one of the sets ([H4, H5, H6, H7]) was the same as that determined by the methodology 400. Thus, this test confirmed the ability of the above-described methodology 400 to select a correct set of fixed tap coefficients for the second exemplary FIR equalizer 108.

Referring to FIG. 7A, a table 710 showing the initial tap coefficients for a third exemplary FIR equalizer 108 is illustrated. The initial tap coefficients are listed vertically along the left-hand side of the table 710. Using the methodology 400 of FIG. 4, the initial seventeen tap coefficients were up sampled by eight to yield 136 coefficients. The 136 coefficients were then used to produce a first waveform 700, as shown in FIG. 7B. The first waveform 700 was then convolved 406 with a sinc function to generate a second waveform 702 comprising multiple lobes. Each lobe was then integrated to determine its power (i.e., area). The two largest lobes 704a, 704b were selected and the four taps closest to the largest lobes 704a, 704b were determined. In this example, the four taps that were closest to the lobes 704a, 704b were taps 2, 3, 4, and 5. Thus, as shown in FIG. 7A, the coefficients H2, H3, H4, and H5 were fixed using the methodology 400, as indicated in bold type.

The instant inventors tested the third real-world FIR equalizer 108 and found that the FIR equalizer 108 converged (i.e., was stable) using three different sets of four fixed tap coefficients. The three sets of tap coefficients are shown in the table 710 of FIG. 7A. More specifically, the sets [H2, H3, H4, H5], [H3, H4, H5, H6], and [H4, H5, H6, H7] were each found to stabilize the FIR equalizer 108. As shown, one of the sets ([H2, H3, H4, H5]) was the same as that determined by the methodology 400. Thus, this test also confirmed the ability of the above-described methodology 400 to select a correct set of fixed tap coefficients for the third exemplary FIR equalizer 108.

It should be recognized that different variations of the methodology 400 as it relates to FIGS. 5A through 7C are possible. For example, the number of lobes selected and the number of fixed tap coefficients selected for the lobes may vary in different embodiments of the methodology 400. For example, in one alternative embodiment, the methodology 400 determines the single largest lobe and fixes the coefficients of the closest three or four taps with respect to the single largest lobe. In another embodiment, more than two adjacent largest lobes are determined and the coefficients of a tap or group of taps closest to the group of largest lobes are fixed. Other variations are possible and within the scope of the invention.

The flowcharts and/or block diagrams in the Figures illustrate the architecture, functionality, and operation of possible implementations of systems, methods, and computer-usable storage media according to various embodiments of the present invention. In this regard, each block in the flowcharts and/or block diagrams may represent a module, segment, or portion of code, which comprises one or more executable instructions for implementing the specified logical function(s). It should also be noted that, in some alternative implementations, the functions noted in a block may occur in a different order than that illustrated in the Figures. For example, two blocks shown in succession may, in fact, be implemented in the reverse order, depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The invention claimed is:

1. A method for selecting which tap coefficients of a programmable finite-impulse-response (FIR) equalizer to fix, the method comprising:
    performing an initial calibration to determine an initial value for each tap coefficient of a FIR equalizer;
    producing a first waveform using the initial values, the first waveform comprising plurality of spikes having magnitudes representing the initial values;
    performing an operation on the first waveform to produce a smoother second waveform that represents a modified version of the first waveform, the second waveform comprising a plurality of lobes;
    analyzing the second waveform to determine at least one lobe of the second waveform that has the largest area; and
    fixing the coefficient of at least one tap that is closest to the at least one lobe.

2. The method of claim 1, wherein performing the operation comprises convolving a function with the first waveform to produce the second waveform.

3. The method of claim 2, wherein the function is a sinc function.

4. The method of claim 1, wherein the at least one lobe is a single lobe.

5. The method of claim 1, wherein the at least one lobe is a group of several adjacent lobes.

6. The method of claim 1, wherein the at least one tap is a single tap.

7. The method of claim 1, wherein the at least one tap is a group of several adjacent taps.

8. The method of claim 1, wherein producing the first waveform comprises upsampling the initial values to produce the first waveform.

9. The method of claim 1, further comprising determining the plurality of lobes by finding zero crossings of the second waveform.

10. An apparatus for selecting which tap coefficients of a programmable finite-impulse-response (FIR) equalizer to fix, the apparatus comprising:
    a tape drive configured to perform the following:
        perform an initial calibration to determine an initial value for each tap coefficient of a FIR equalizer;
        produce a first waveform using the initial values, the first waveform comprising plurality of spikes having magnitudes representing the initial values;
        perform an operation on the first waveform to produce a smoother second waveform that represents a modified version of the first waveform, the second waveform comprising a plurality of lobes;
        analyze the second waveform to determine at least one lobe of the second waveform that has the largest area; and
        fix the coefficient of at least one tap that is closest to the at least one lobe.

11. The apparatus of claim 10, wherein the tape drive is further configured to perform the operation by convolving a function with the first waveform to produce the second waveform.

12. The apparatus of claim 11, wherein the function is a sinc function.

13. The apparatus of claim 10, wherein the at least one lobe is a single lobe.

14. The apparatus of claim 10, wherein the at least one lobe is a group of several adjacent lobes.

15. The apparatus of claim 10, wherein the at least one tap is a single tap.

16. The apparatus of claim 10, wherein the at least one tap is a group of several adjacent taps.

17. The apparatus of claim 10, wherein the tape drive is configured to produce the first waveform by up sampling the initial values.

18. The apparatus of claim 10, wherein the tape drive is further configured to determine the plurality of lobes by finding zero crossings of the second waveform.

19. A computer program product for selecting which tap coefficients of a programmable finite-impulse-response (FIR) equalizer to fix, the computer program product comprising a non-transitory computer-readable storage medium having computer-usable program code embodied therein, the computer-usable program code comprising:
    computer-usable program code to perform an initial calibration to determine an initial value for each tap coefficient of a FIR equalizer;
    computer-usable program code to produce a first waveform using the initial values, the first waveform comprising a plurality of spikes having magnitudes representing the initial values;
    computer-usable program code to perform an operation on the first waveform to produce a smoother second waveform that represents a modified version of the first waveform, the second waveform comprising a plurality of lobes;
    computer-usable program code to analyze the second waveform to determine at least one lobe of the second waveform that has the largest area; and
    computer-usable program code to fix the coefficient of at least one tap that is closest to the at least one lobe.

20. The computer program product of claim 19, wherein performing the operation comprises convolving a function with the first waveform to produce the second waveform.

\* \* \* \* \*